(12) United States Patent
Otremba (10) Patent No.: US 8,410,591 B2
(45) Date of Patent: Apr. 2, 2013

(54) SEMICONDUCTOR MODULE WITH MULTIPLE SEMICONDUCTOR CHIPS

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 738 days.

(21) Appl. No.: 11/693,333

(22) Filed: Mar. 29, 2007

(65) Prior Publication Data

US 2008/0224323 A1 Sep. 18, 2008

(30) Foreign Application Priority Data

Mar. 15, 2007 (DE) .......................... 10 2007 013 186

(51) Int. Cl.
*H01L 23/02* (2006.01)
(52) U.S. Cl. ......... 257/678; 257/676; 257/778; 257/784
(58) Field of Classification Search .................. 257/778, 257/784, 676, 678
See application file for complete search history.

(56) References Cited

U.S. PATENT DOCUMENTS

| | | | |
|---|---|---|---|
| 4,903,120 A | 2/1990 | Beene et al. | |
| 5,019,893 A | 5/1991 | Frank et al. | |
| 5,245,216 A * | 9/1993 | Sako | 257/676 |
| 5,568,682 A | 10/1996 | Gates, Jr. et al. | |
| 6,291,880 B1 * | 9/2001 | Ogawa et al. | 257/723 |
| 6,307,755 B1 | 10/2001 | Williams et al. | |
| 6,313,598 B1 * | 11/2001 | Tamba et al. | 318/722 |
| 6,421,244 B1 * | 7/2002 | Shinohara et al. | 361/736 |
| 6,424,550 B2 | 7/2002 | Grundl et al. | |
| 6,593,622 B2 * | 7/2003 | Kinzer et al. | 257/341 |
| 6,638,808 B1 * | 10/2003 | Ochi | 438/238 |
| 6,677,669 B2 | 1/2004 | Standing | |
| 6,756,658 B1 | 6/2004 | Gillett et al. | |
| 6,809,411 B2 | 10/2004 | Hierholzer | |
| 6,822,399 B2 * | 11/2004 | Feldtkeller et al. | 315/209 R |

(Continued)

FOREIGN PATENT DOCUMENTS

| | | | |
|---|---|---|---|
| DE | 19826731 | 10/2000 | |
| DE | 19927285 | 12/2000 | |
| DE | 102006049949 B3 * | 5/2008 | 257/690 |
| EP | 0265833 | 7/1991 | |

OTHER PUBLICATIONS

First Examination Report of DE102007013186.2-33 dated Jan. 2, 2008.

(Continued)

*Primary Examiner* — David Vu
*Assistant Examiner* — Caleb Henry
(74) *Attorney, Agent, or Firm* — Banner & Witcoff, Ltd.

(57) ABSTRACT

A semiconductor module (1) which has semiconductor chips (2) each with one power supply electrode (6, 7) on its back, respectively for applying a supply potential (4, 5) and each with a power output electrode (8, 9) on its top side, respectively for transferring an output current to power outputs (10, 11, 12) of the semiconductor module (1). Furthermore, the semiconductor chips (2) have control electrodes (14, 15) for switching the semiconductor component. The semiconductor module has on its underside leads with supply leads on which the semiconductor chips (2, 3) are arranged with their power supply electrodes (6, 7). In addition, output leads (22, 23, 24) are effectively connected to the power output electrodes (8, 9). Finally, signal leads (25, 26, 27), which are effectively connected to the control electrodes (14, 15) or the power output electrodes (8, 9) are arranged on the underside of the semiconductor modules.

41 Claims, 9 Drawing Sheets

U.S. PATENT DOCUMENTS

| | | | | |
|---|---|---|---|---|
| 6,946,740 B2* | 9/2005 | Schaffer | ................ | 257/777 |
| 7,042,730 B2* | 5/2006 | Vaysse et al. | ............. | 361/719 |
| 7,064,442 B1 | 6/2006 | Lane et al. | | |
| 7,109,577 B2* | 9/2006 | Shiraishi et al. | ........ | 257/690 |
| 7,208,818 B2* | 4/2007 | Luo et al. | ............ | 257/666 |
| 7,227,198 B2* | 6/2007 | Pavier et al. | .......... | 257/177 |
| 7,312,516 B2* | 12/2007 | Corisis | ................ | 257/676 |
| 7,763,974 B2* | 7/2010 | Takahashi et al. | ........ | 257/724 |
| 8,115,294 B2* | 2/2012 | Otremba et al. | ......... | 257/690 |
| 2003/0075796 A1* | 4/2003 | Hata et al. | ............ | 257/734 |
| 2004/0004272 A1* | 1/2004 | Luo et al. | ............ | 257/666 |
| 2004/0227547 A1* | 11/2004 | Shiraishi et al. | ........ | 327/110 |
| 2005/0121777 A1 | 6/2005 | Hata et al. | | |
| 2005/0133863 A1* | 6/2005 | Werner et al. | ........ | 257/341 |
| 2005/0151236 A1* | 7/2005 | Oliver et al. | .......... | 257/685 |
| 2005/0173713 A1* | 8/2005 | Lin et al. | ............. | 257/81 |
| 2005/0206010 A1 | 9/2005 | Noquil et al. | | |
| 2006/0071238 A1* | 4/2006 | Guerra et al. | ........ | 257/177 |
| 2006/0076660 A1* | 4/2006 | Boschlin et al. | ....... | 257/678 |
| 2006/0113664 A1 | 6/2006 | Shiraishi et al. | | |
| 2007/0132079 A1* | 6/2007 | Otremba et al. | ........ | 257/685 |
| 2007/0200537 A1* | 8/2007 | Akiyama et al. | ........ | 323/234 |
| 2007/0216011 A1* | 9/2007 | Otremba et al. | ........ | 257/690 |
| 2007/0252265 A1* | 11/2007 | Sander | ............ | 257/691 |

OTHER PUBLICATIONS

Sawle, et al., "DirectFET (TM) (International Rectifier) A Proprietary New Source Mounted Power Package for Board Mounted Power", published prior to filing the present application, 5 pages.

Zeeland van, J.: GWM: Trench-MOSFETs im ISOPLUS-DIL-Gehause "Power mit Sixpack", 2005, 3 pages.

\* cited by examiner

SEMICONDUCTOR MODULE WITH MULTIPLE SEMICONDUCTOR CHIPS

RELATED APPLICATION

This application claims priority from German Patent Application No. DE 10 2007 013 186.2, which was filed on Mar. 15, 2007, and is incorporated herein by reference in its entirety.

TECHNICAL FIELD

The invention relates to a semiconductor module with semiconductor chips and to a method for producing it.

BACKGROUND

The semiconductor chips have at least one power supply electrode for applying a supply potential and one power output electrode for transmitting an output current to power outputs of the semiconductor module and a control electrode.

Such a semiconductor module can be used as half bridge assembly and, for switching electrical powers, has at least two semiconductor switches which are connected in series for forming half bridges. For this purpose, the half bridge assembly has three electrically conductive rails which are arranged adjacently to one another in parallel. On a centrally arranged power output rail, low-side switches (LSS) of the half bridge are arranged. On a parallel high-potential supply rail mounted on the side of this, high-side switches (HSS) are arranged and a parallel low-potential supply rail mounted oppositely supplies power electrodes on the top side of the LSS switches via bonds. In addition, the power electrodes on the top side of the HSS switches are electrically connected to the central power output rail via wire bonds.

In such a semiconductor module, it is not possible to access the power output electrodes of a number of LSS switches individually. It is thus not possible to drive individual nodes of a number of half bridge circuits.

Finally, the control electrodes cannot be accessed in the same plane as the power supply rails or the power output terminals. Instead, this requires planes stacked above one another. The control electrodes of the semiconductor chips can only be accessed via a stacked control plane which is arranged on an insulation layer stacked on the electrically conductive rails. Thus, these cannot be driven individually, either, but can only be reached via common feed lines. This considerably restricts the possible uses of such a semiconductor module and does not permit any drive modifications on a circuit board.

Other semiconductor modules have external contact arrangements or so-called "footprints" which are so disadvantageous that the rewiring effort by corresponding conductor track runs on a higher-level circuit board is considerable. This requires additional board surface which does not allow the current and voltage supply in on-board systems and/or in converters such as AC/DC and/or DC/DC to be made more compact.

SUMMARY

According to an embodiment, a semiconductor module may have semiconductor chips each with one power supply electrode on its back, respectively for applying a supply potential and each with one power output electrode on its top side, respectively for transmitting an output current to power outputs of the semiconductor module. Furthermore, the semiconductor chips may have control electrodes for switching the semiconductor components. The semiconductor module may also have on its underside leads with supply leads on which the semiconductor chips with their power supply electrodes are arranged. In addition, output leads can be effectively connected to the power output electrodes. Finally, signal leads which are effectively connected to the control electrodes or the power output electrodes are arranged on the underside of the semiconductor modules.

BRIEF DESCRIPTION OF THE DRAWINGS

Further embodiments will now be explained in greater detail with reference to the attached figures.

DETAILED DESCRIPTION

Figure 1:
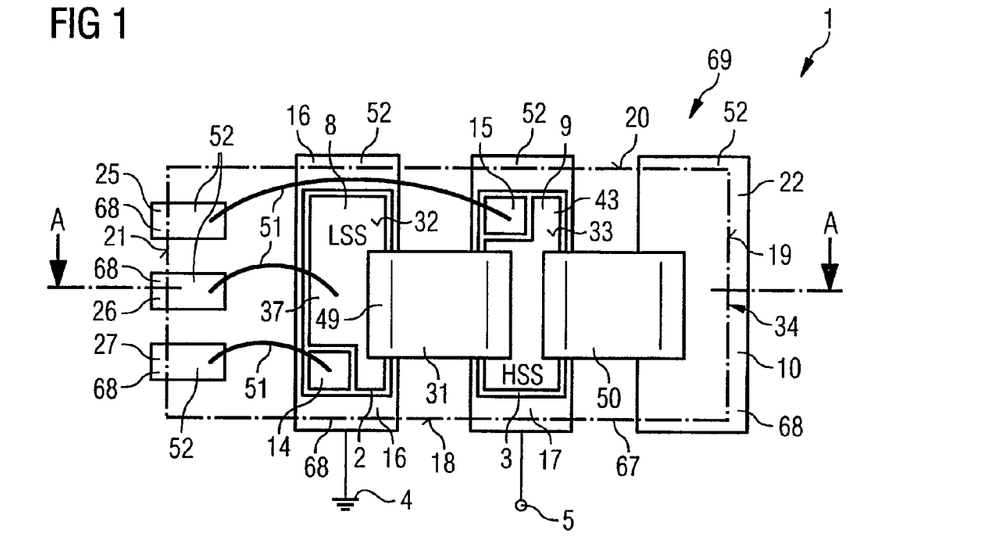
FIG. 1 shows a diagrammatic top view of a semiconductor module according to an embodiment.

FIG. 1 shows a diagrammatic top view of a semiconductor module 1 according to a first embodiment. Of the semiconductor module 1, only the leads 68 of a semiconductor module position 69 of a lead frame, with the aid of which a number of such semiconductor modules 1 can be produced, can be seen in FIG. 1. Furthermore, the plastic package compound has been omitted and its outline is only identified by a dot-dashed line 67 in order to be able to show the arrangement of semiconductor chips 2 and 3 and the type and size of connecting elements 49, 50 and 51 of the semiconductor module 1 of the first embodiment. The semiconductor module 1, according to an embodiment, represents a half bridge circuit which has two supply leads 16 and 17 arranged in parallel and adjacently to one another, on which different and complementary MOSFETs, respectively, are fixed with their power supply electrodes as semiconductor chips 2 and 3.

According to an embodiment, the one supply lead 16 has a low supply potential 4 in the form of a ground potential, whilst the second supply lead 17, arranged adjacently and oriented in parallel with the first supply lead 16, is at a high supply potential 5 which is given, for example, by the operating voltage $V_{SS}$ of an on-board system. The difference between the two semiconductor chips 2 and 3, according to an embodiment, consists in that one semiconductor chip 2 is arranged as low side switch (LSS) on the supply lead 16 with low supply potential 4 and the other semiconductor chip 3 is arranged as high side switch (HSS) on the high supply potential 5. A further difference between the semiconductor chips 2 and 3, according to an embodiment, consists in that the semiconductor chip 2 on the low supply potential 4 is a p-channel MOSFET 37, whilst the second semiconductor chip 3 on the high supply potential 5 is an n-channel MOSFET 43. This enables the control electrodes 14 and 15 of the two semiconductor chips 2 and on 3, respectively, to be arranged on the top side 32 of the first semiconductor chip 2 and on the top side 33 of the second semiconductor chip 3, respectively, in forming a half bridge.

According to an embodiment, the large-area power output electrodes 8 and 9 of the semiconductor chips 2 and 3 are arranged on the top sides 32 and 33, respectively, and can be electrically connected to form a circuit node 31 via a large-area connecting element 49 in the form of a bonding strip. This circuit node 31 of the circuit is located at the same time on one of the signal leads 26 and is electrically connected to the signal lead 26 via a wire bond 51.

The other two signal leads 25 and 27 are connected to the control electrodes 14 and 15 via wire bonds 51, according to an embodiment. A further bonding strip is arranged as connecting element 50 between the circuit node 31 of the semiconductor bridge circuit 34 and an output lead 22, according to an embodiment, so that the output current of the half bridge 34 can be picked up at the large-area external contact 52, arranged on the side of the supply leads 16 and 17, of the power output 10. The arrangement of leads 68 with respect to one another is provided so as to save space and area in that the signal leads 25 to 27 are arranged in one peripheral side area 21 and the output lead 22 is provided in the opposite edge area 19, whilst the supply leads 16 and 17 extend between the two edge areas 19 and 21, from an edge area 18 to an edge area 20.

According to an embodiment, for different supply potentials, the semiconductor module 1 according to FIG. 1 has on its underside the supply leads 16 and 17, which are arranged in parallel adjacently to one another, on which the semiconductor chips 2 and 3 are arranged with their power supply electrodes 6 and 7. According to an embodiment, on an edge area 19 of the underside of the semiconductor module 1, output leads 22 which are effectively connected to the power output electrodes 8 and 9 are arranged perpendicularly to the supply leads 16 and 17, respectively. On an opposite edge area 21 perpendicularly to the supply leads 16 and 17, signal leads 25, 26 and 27 are arranged, according to an embodiment, which are electrically connected to the control electrodes 14 and 15 and/or the power output electrodes 8 and 9. According to an embodiment, the leads are arranged in one plane on the underside of the semiconductor module 1 and can be advantageously mounted simultaneously on a surface of a high-level circuit board.

This embodiment creates a semiconductor module 1 of reduced volume which can switch electrical powers and has an external contact arrangement which can be used in an area-saving manner and enables individual electrodes and nodes of circuits having at least two semiconductor chips to be accessed.

Figure 2:
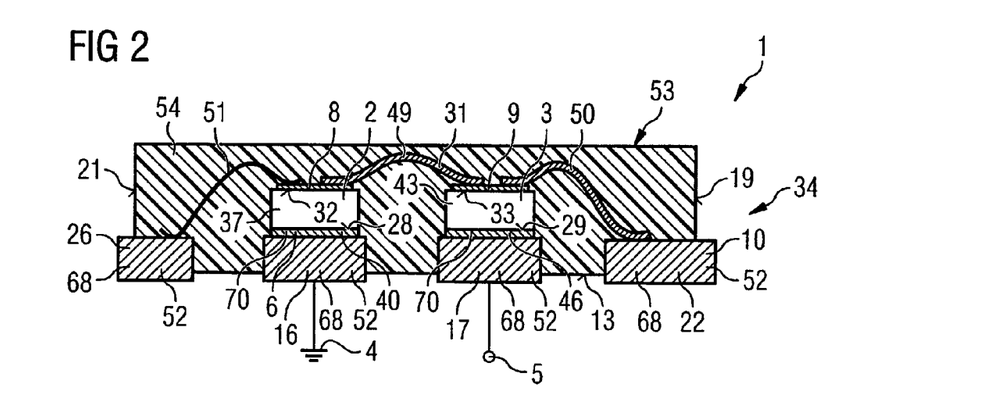
FIG. 2 shows a diagrammatic cross section through the semiconductor module according to FIG. 1 along the section plane A-A.

FIG. 2 shows a diagrammatic cross section through the semiconductor module 1 according to FIG. 1 along the section plane A-A. Components having identical functions as in FIG. 1 are marked by the same reference symbols and will not be explained separately. In this diagrammatic cross section, only the center signal lead 26 of the three signal leads 25 to 27 arranged in the edge area 21 can be seen which is electrically connected to the circuit node 31 of the half bridge circuit 34 via a wire bond 51. For this purpose, the wire bond 51 contacts the power output electrode 8 of the semiconductor chip 2 on its top side 32. The power output electrodes 8 and 9 of the semiconductor chips 2 and 3 are connected via the connecting element 49 to form a circuit node 31 of the half bridge circuit 34, this connecting element 49 having either a number of aluminum bonding wires which are distinctly thicker than the bonding wires 51 or are electrically connected to one another via wide bonding strips. A further connecting element 50 which carries high current is connected electrically to the output lead 22 as power output 10 of the half bridge circuit 34 in the edge area 19 of the semiconductor module 1.

This cross section also shows clearly that the semiconductor chips 2 and 3 with their large-area power supply electrodes 6 and 7, which form the backs 28 and 29, respectively, of the semiconductor chips 2 and 3, respectively, are fixed on the supply leads 16 and 17, arranged in parallel adjacently to one another, for example via a diffusion solder layer 70. In addition, FIG. 2 clearly shows that a plastic package compound 54 forms a plastic package 53, wherein the leads 68 with their external contacts 52 remain free of plastic package compound 54.

In an embodiment, the semiconductor chips 2 and 3 have on their backs large-area power supply electrodes 6 and 7, the two-dimensional extents of which correspond to backs 28 and 29 and which are arranged with their backs 28 and 29 on the supply leads 16 and 17. To implement a half bridge circuit 34 in this embodiment, two complementary semiconductor chips 2 and 3 of the MOSFET type or of the IGBT type are used, an n-channel MOSFET being combined with a p-channel MOSFET in the case of the MOSFET type. A p-channel MOSFET is then preferably used for the LSS switch, whereas an n-channel MOSFET is used for the HSS switch so that both semiconductor chips can be soldered or bonded directly to the supply leads 16 and 17 with their large-area power supply electrodes 6 and 7 on their backs 28 and 29, according to an embodiment.

For this purpose, according to an embodiment, a diffusion solder material is applied to the backs 28 and 29 of the semiconductor chips 2 and 3 and/or to the supply leads 16 and 17. This diffusion solder material enables the power supply electrodes 6 and 7 of the semiconductor chips 2 and 3 to be mounted on the supply leads 16 and 17 under a predetermined pressure force at a diffusion soldering temperature. This creates intermetallic phases which have a higher melting point than the diffusion soldering temperature. The semiconductor chips 2 and 3 are thus also fixed stably on the supply leads 16 and 17 for the subsequent process temperatures. According to an embodiment, the diffusion solder material used can be preferably a material from the group AuSn, AgSn, CuSn or AgIn. In this process, the diffusion solder layer electrically and mechanically connects at least one large-area power supply electrode 6 or 7 of a semiconductor chip 2 or 3 to a supply lead 16 or 17 within the semiconductor module 1.

Whereas the backs 28 and 29 of the semiconductor chips 2 and 3 are fixed on the supply leads 16 and 17, the semiconductor chips 2 and 3 have on their top sides 32 and 33 small-area control electrodes and large-area power output electrodes, the two-dimensional extents of the power output electrodes 8 and 9 corresponding almost to the top sides 32 and 33, respectively, according to an embodiment. To connect these power output electrodes 8 and 9 together to form a circuit node 31, they are connected to one another via a bonding strip as connecting element 49, according to an embodiment. To also connect these power output electrodes 8 and 9 to an output lead 22, according to an embodiment, bonding strips are also of advantage since they can conduct a higher current than simple bonding wires. On the other hand, it is also possible to use, according to an embodiment, instead of thin gold bonding wires which are preferably used for signal connections, thick aluminum bonding wires in the case of power output electrodes, the cross section of which is usually thicker by one order of magnitude than the cross section of the fine gold bonding wires which usually have a diameter between 18 μm and 40 μm.

Figure 3:
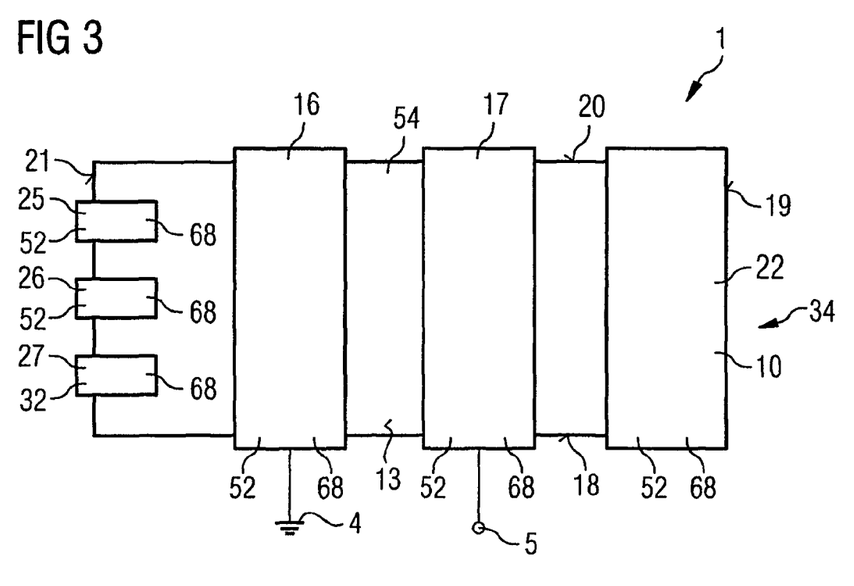
FIG. 3 shows a diagrammatic bottom view of the semiconductor module according to FIG. 1.

FIG. 3 shows a diagrammatic bottom view of the semiconductor module 1 according to FIG. 1. This bottom view again shows the arrangement of the different leads 68, already described above, which are here held together by the plastic package compound 54 and form surface-mountable external contacts 52.

The semiconductor module 1 has at least one half bridge circuit with two semiconductor chips. On the other hand, the arrangement of the leads 68 of such a semiconductor module is particularly well suited to semiconductor modules which have a number of half bridge circuits. For this purpose, according to an embodiment, a supply lead 16 which, for example, is connected to ground potential, can have p-channel MOSFETs which are fixed with their drain electrodes on the supply lead 16. A further supply lead 17, which is at a supply potential 5, can have n-channel MOSFETs which are fixed with their drain electrodes on the supply lead 17, according to an embodiment. In this arrangement, the number of semiconductor chips, both on the supply lead 16 with a ground potential and on the supply lead 17 with a supply potential, can be increased arbitrarily in order to be able to drive, for example, multi-phase systems and/or switch correspondingly higher currents, according to an embodiment.

Figure 5:
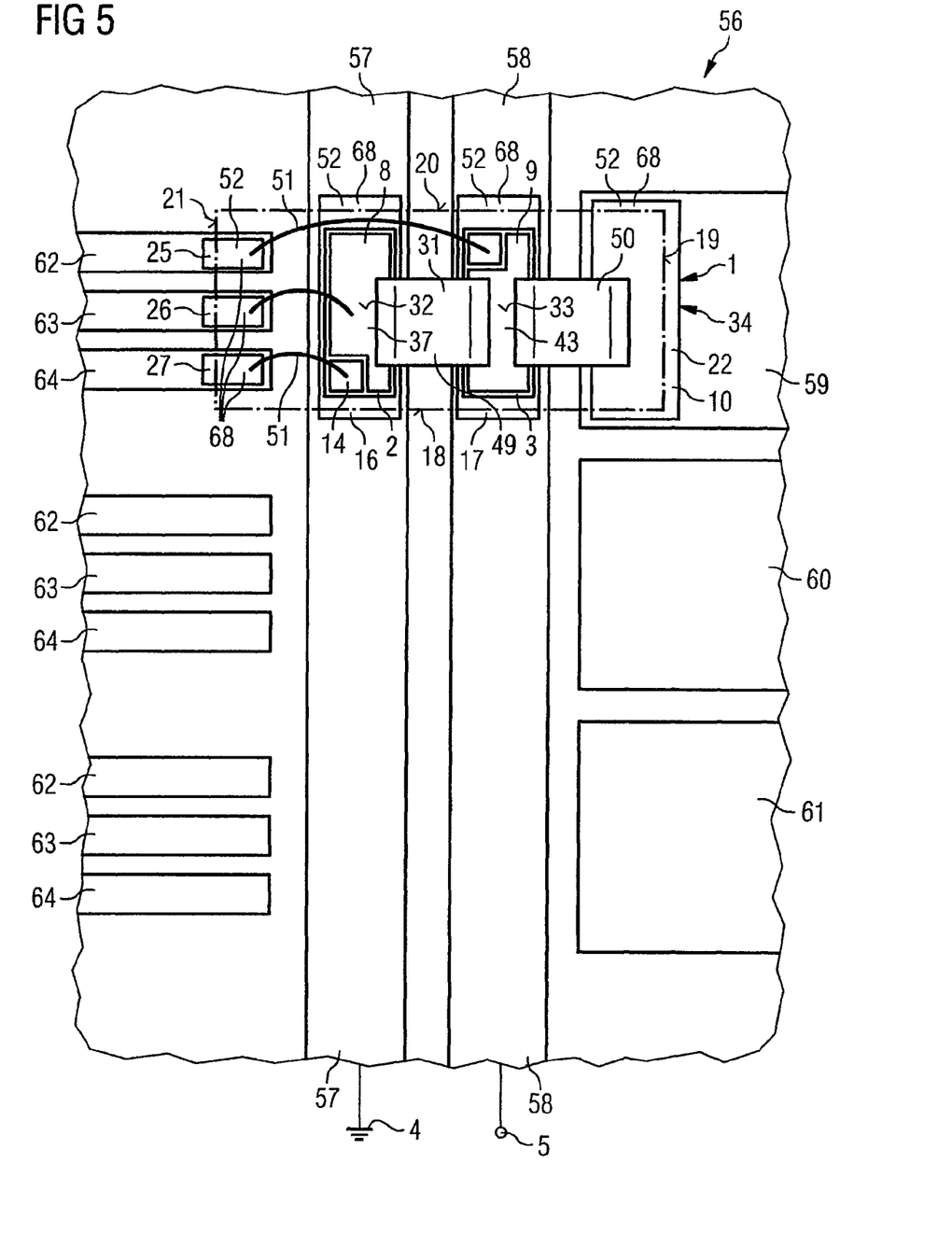
FIG. 5 shows a diagrammatic top view of the circuit board according to FIG. 4 with a surface-mounted semiconductor module according to FIG. 1.
Figure 13:
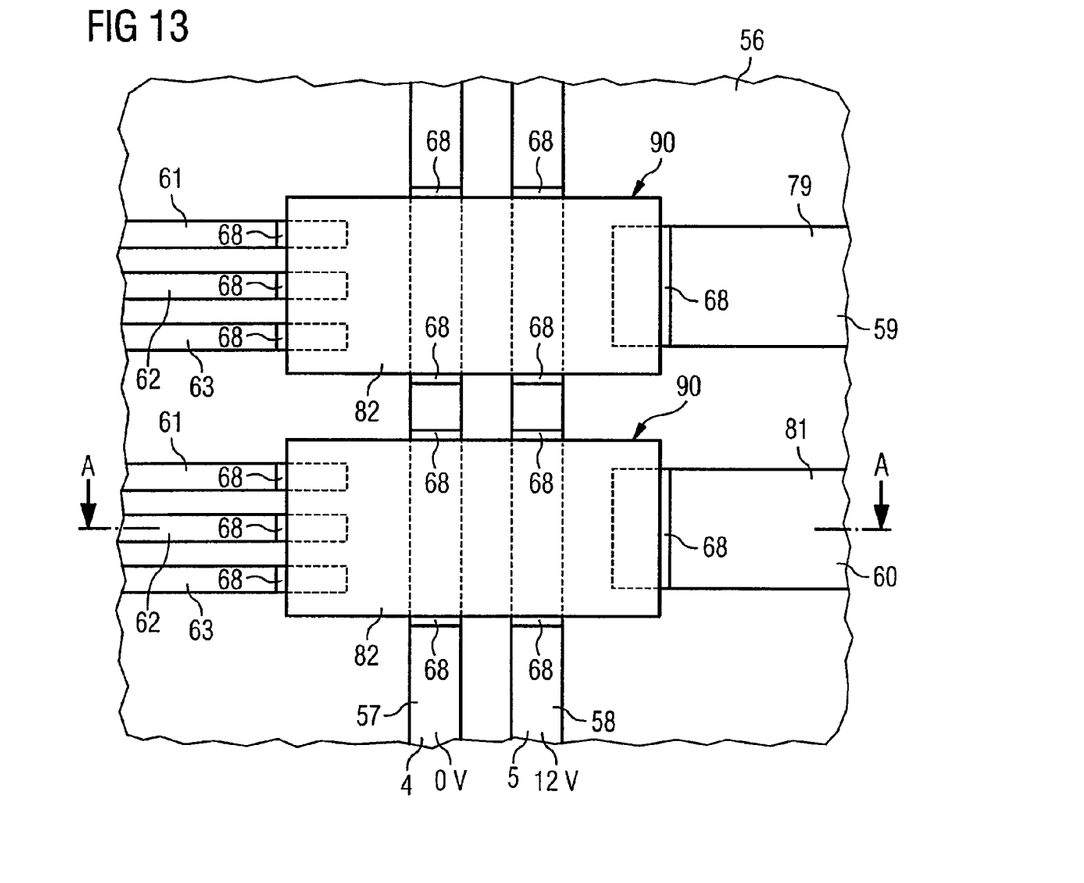
FIG. 13 shows a diagrammatic top view of a circuit board with mounted semiconductor modules of a two-phase circuit according to a further embodiment.

As shown in FIG. 2, it may also be provided, according to an embodiment, that the power output electrodes 8 and 9 of the semiconductor chips 2 and 3 of an individual half bridge circuit 34 are electrically connected to one another via connecting elements 49 and form a circuit node 31 which is electrically connected to one of the output leads 22 via a further connecting element 50. With the lead arrangements provided for the semiconductor module 1, according an embodiment, as shown in FIGS. 3, 5 and 13, such a semiconductor module with a number of half bridge circuits can be advantageously implemented cost-effectively and with little rewiring effort.

Figure 4:
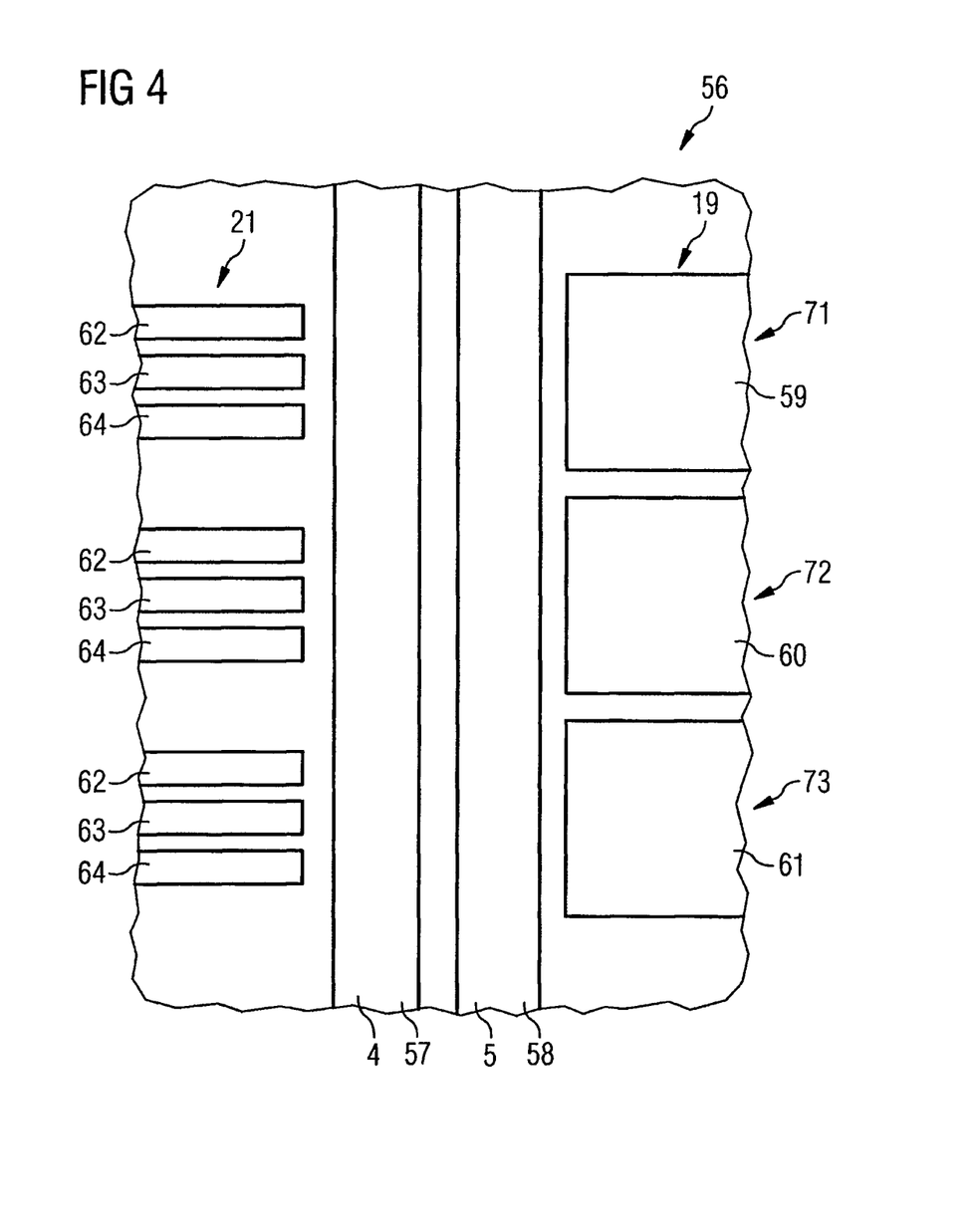
FIG. 4 shows a diagrammatic top view of a higher-level circuit board for semiconductor modules according to FIG. 1.

FIG. 4 shows a diagrammatic top view of a circuit board 56 for semiconductor modules 1 according to FIG. 1. In this embodiment of the circuit board 56, three positions 71, 72 and 73 are provided for semiconductor modules 1 as shown in FIG. 1. The two central supply potential rails 57 and 58 arranged in parallel and adjacently to one another, which are at different supply potential 4 and 5, are characterizing of such an area-optimized circuit board 56.

For each of the three semiconductor module positions 71, 72 and 73 shown here, three signal input terminals 62, 63 and 64 are provided in an edge area 21 perpendicularly to the supply potential rails 57 and 58 so that each semiconductor bridge can be driven individually via the circuit board 56, according to an embodiment.

In the opposite edge area 19 of the circuit board 56, corresponding power output terminals 59, 60 and 61 are arranged in the semiconductor module positions 71, 72 and 73, according to an embodiment. Each half bridge thus has its own power output terminal. Only the supply potential rails 57 and 58 are common to all half bridges connected in parallel. By individually separating the drives and the power outputs of the individual semiconductor bridges due to the arrangement of terminals 59 to 64 and of the supply potential rails 57 and 58 on the circuit board 56 it is possible, for example, also to implement multi-phase motor drives.

FIG. 5 shows a diagrammatic top view of the circuit board 56 according to FIG. 4 with surface-mounted semiconductor module 1 according to FIG. 1. Components having the same functions as in the preceding figures are marked by the same reference symbols and are not explained separately. This embodiment in FIG. 5 again demonstrates the advantages made possible both by the circuit board 56 and the semiconductor module 1 with the power supply rails 57 and 58, arranged in parallel and adjacently to one another, and the supply leads 16 and 17, arranged in parallel and adjacently to one another, of the semiconductor module 1. Such a higher-level circuit board 56 can be supplemented at any time by further half bridges 34, either in order to produce full bridges and/or supply multi-phase motors via the half bridges 34 or via full bridges. It is also possible, according to an embodiment, to arrange an arbitrarily large number of half bridges in parallel on such a circuit board 56 in view of the increasingly rising current demands on DC/DC converters and/or AC/DC converters.

Thus, in spite of common supply potential rails 56 and 57 for a number of semiconductor chips which are fixed on these common supply potential rails 56 and 57, the module components composed of two semiconductor chips 2 and 3 as shown in FIG. 5 can be driven individually on different supply leads, according to an embodiment, both via the two control electrodes 14 and 15 of the two semiconductor chips 2 and 3 and via a circuit node 31 which is formed by the two power output electrodes 8 and 9 on semiconductor chips 2 and 3 which are at different potential. In addition, this semiconductor module for in each case two semiconductor chips 2 and 3 makes it possible to provide an output lead 22, according to an embodiment. Although a number of semiconductor chips 2 and 3 are arranged at different supply potentials 4 and 5, two interacting semiconductor chips 2 and 3 can be driven both separately and provided with a common power output terminal 22.

The signal leads 62, 63 and 64 are electrically connected to the control electrodes 14 and 15, respectively, and/or the power output electrodes 8 and 9 via bonding wires 51, according to an embodiment, wherein a thin gold bonding wire of the abovementioned diameter can be used for such bonding wires 51. According to an embodiment, attention must be paid to the fact that some bonding wires 51 must be pulled from the side on which the signal leads 62, 63 and 64 are located to the top side 33 of the semiconductor chip 3 without touching the intermediate top side 32 of the intermediately arranged second semiconductor chip 2. When applying a plastic package compound for packaging the module in a plastic package, such long bonding wires 51 tend to drift. To prevent this, it may of advantage to use a somewhat thicker bonding wire for long extended bonding wires 51, according to an embodiment.

The HSS MOSFET can have an integrated gate driver, according to an embodiment. This advantageously reduces the complexity of the rewiring on a circuit board. Both lateral and vertical power semiconductor patterns can be used as semiconductor chips 2 and 3, a further embodiment providing for constructing the control electrode 14 or 15 of the semiconductor chips 2 or 3 as vertical trench gate electrode.

If IGBT semiconductor chips are used instead of MOSFETs, according to an embodiment, the power supply electrodes 6 and 7 form the collector electrodes of these semiconductor chips 2 and 3, respectively, and the power output electrodes 8 and 9 are formed by the emitter electrodes of these vertical IGBTs (insulated gate bipolar transistors), whilst the control electrodes 14 and 15 are insulated gate electrodes. The leads 68 themselves are embedded with their top sides in the plastic package compound and have on their undersides flat external contacts of the semiconductor module.

To form flat external contacts of the semiconductor module, according to an embodiment, the components such as the at least two semiconductor chips 2 and 3, the connecting elements 49, 50 and 51 and the surfaces of the leads 68 are embedded in a plastic package compound, whereas the external contact areas of the leads 68 on the underside of the semiconductor module are kept free of plastic package compound during the embedding.

According to an embodiment, the semiconductor module can have a capacitor between a power output and a low supply potential 4 in order to achieve a smoothing effect, for example in the case of an AC/DC converter. The semiconductor modules, according to an embodiment, are preferably used for current and voltage supply with the previously mentioned AC/DC and/or DC/DC converters, the semiconductor module providing at least one of the converters.

It is, thus, possible with at least one semiconductor module to arrange a multiplicity of, for example, half bridge circuits which can be individually driven behind one another on the circuit module since the supply potential rails 57 and 58 are arranged in parallel adjacently to one another corresponding to the supply leads of the semiconductor module. In this embodiment, power output terminals 59, 60 and 61 for the output leads of the semiconductor module are arranged perpendicularly to the supply potential rails 57 and 58 on the circuit board 56 on one side of the supply potential rails. On an opposite side, signal input terminals 62, 63 and 64 for the signal leads of the semiconductor module are provided, according to an embodiment. The principle of two adjacently arranged supply rails 57 and 58 on the circuit board 56 simplifies the patterns required for arranging, for example, a capacitor between a supply potential rail 57 and a power output terminal 59, 60 or 61.

It is also provided to connect electrically on the circuit board 56 signal input terminals 62, 63 and 64, according to an embodiment, to at least one integrated control circuit of a control IC via conductor tracks of the circuit board 56. This control IC drives both a circuit node of a half bridge circuit and the control electrodes 14 and 15 of semiconductor chips 2 and 3, respectively, of this half bridge circuit 34. This control circuit in the form of a control IC is preferably arranged on one side of the circuit board 56 which is perpendicular to the supply potential rails 57 and 58 so that short conductor tracks are possible in an area-saving manner on the circuit board 56 to the signal input terminals 62, 63 and 64. This clearly shows that the concept according to an embodiment of patterning a semiconductor module in such a manner that it has in parallel adjacently to one another different supply leads and transversely thereto leads for signal inputs on one side and leads for power outputs on the opposite side, represents a distinct area-saving simplification in the design and structure of circuit boards 56, particularly for an on-board system with a semiconductor module in MCM (multi-chip module) construction.

Figure 6:
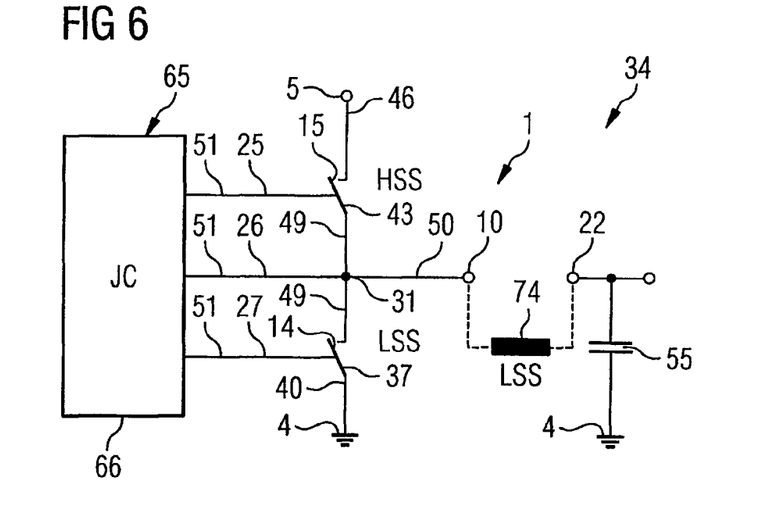
FIG. 6 shows a basic circuit diagram of a semiconductor bridge circuit of a semiconductor module according to FIG. 1.

FIG. 6 shows a basic circuit diagram of a semiconductor bridge circuit 34 of a semiconductor module 1 according to FIG. 1. For this moduleAccording to an embodiment, an LSS switch and an HSS switch are arranged in series between a low potential 4 and a high potential 5. Both the circuit node 31 and the control electrodes 14 and 15 of the switches are supplied with control signals by an integrated control circuit 65 of a control IC 66, this control IC 66 being arranged in a space-saving manner on the side to which the signal leads 25 to 27 of the semiconductor module 1 are arranged on the circuit board 56 which is shown in FIG. 5. In addition, it is not a problem to arrange, for example, a smoothing capacitor 55 and/or a coil 74 in an area-saving manner between the respective output leads 22 of the circuit output 10 and, for example, the low supply potential 4, according to an embodiment.

According to a further embodiment, a method for producing a semiconductor module with semiconductor chips at different supply potentials may have the following method steps. Firstly, semiconductor chips are produced as LSS and HSS switches of half bridge circuits with a large-area power supply electrode on the back and with a small-area control electrode and with a large-area power output electrode on the top side. Furthermore, a lead frame with at least two supply leads arranged in parallel adjacently to one another is produced. In addition, output leads for an edge area of the semiconductor module are arranged perpendicularly to the supply leads. In the opposite edge area, signal leads are provided perpendicularly to the supply leads.

After these preparations, the semiconductor chips are mounted with their backs on the respective supply leads. This is followed by an application of connecting elements between the signal leads and the control electrodes and between the output leads and the power output electrodes of the semiconductor chips. In addition, connecting elements are arranged underneath each other between the power output electrodes of the semiconductor chips. Once this wiring via connecting elements of the at least two semiconductor chips has taken place, these can be embedded with the connecting elements and with surfaces of the leads of the lead frame in a plastic package compound. This is done by leaving external contact areas of the leads exposed. Finally, the lead frame is separated into individual semiconductor modules.

This method has the advantage that a semiconductor module is produced which has on its underside at least two parallel supply leads adjacent to one another which can be used for mounting not only two semiconductor chips but mounting a multiplicity of semiconductor chips in such a manner that they are arranged directly with their large-area power supply electrodes on the supply leads. A further advantage of the method consists in that due to the lead technology, a multiplicity of semiconductor modules can be produced at the same time.

In a preferred embodiment of carrying out the method, diffusion solder layers of a diffusion solder material which has at least one of the substances AuSn, AgSn, CuSn and/or InAG and forms intermetallic phases during diffusion soldering, the melting point of which is distinctly higher than a diffusion soldering temperature, are applied to the power supply electrodes of the backs of the semiconductor chips. For the diffusion soldering, according to an embodiment, the semiconductor chips and the supply leads are heated up to a diffusion soldering temperature $T_D$ of between 180° C.$\leq T_D \leq$450° C.

In the semiconductor module positions of a lead frame, a MOSFET with vertical drift section and vertical trench gate structure and with source electrode on its top side and a drain electrode on its back can be mounted for this purpose, the drain electrode being diffusion soldered onto the supply lead, according to an embodiment. The other power output electrode on the top side can then be connected either to a power output electrode of the second semiconductor chip via a connecting element or to an output lead via a bonding strip or aluminum bonding wires. This embodiment has the advantage that due to the current-conducting bonding strips or aluminum bonding wires, the forward resistance or on resistance of the semiconductor module is kept as low as possible.

Instead of semiconductor chips of the MOSFET type, semiconductor chips of the IGBT (insulated gate bipolar transistor) type can also be used, according to an embodiment. These semiconductor chips have a vertical drift section and frequently a lateral gate structure and have an emitter electrode on the top side as power output electrode and a collector electrode on the back as power supply electrode which can be mounted on the supply leads. Compared with the MOSFET type, the IGBT type, according to an embodiment, has the advantage of higher switching speed and can easily be combined with a MOSFET in a half bridge circuit.

To apply connecting elements between control electrodes of the top sides of the semiconductor chips and signal leads provided in the lead frame, wire bonds are used, preferably composed of the abovementioned gold bonding wires, according to an embodiment.

To produce lead frames, according to an embodiment, plane copper plates can be preferably patterned by stamping or wet or dry etching a plane metal plate. Instead of patterning a metal plate, it is also possible to produce the lead frame by galvanically depositing the lead frame pattern on an auxiliary carrier and then removing the auxiliary carrier from the lead frame produced.

During the subsequent mounting of a semiconductor chip on the supply leads provided in corresponding semiconductor module positions, the semiconductor chips can also be mounted on semiconductor chip islands or so-called "chip pads" which are connected to one another to form a parallel supply lead, according to an embodiment.

For packaging the semiconductor modules of at least two semiconductor chips and the connecting elements, these are embedded in a plastic package compound by means of an injection molding technique, leaving exposed external contacts of the leads on the underside of the semiconductor module, according to an embodiment.

After embedding the individual semiconductor modules in their plastic package in the individual semiconductor module positions of the lead frame, the latter is separated into individual power semiconductor modules by laser technology or by etching methods or by sawing and/or stamping, according to an embodiment.

Figure 7:
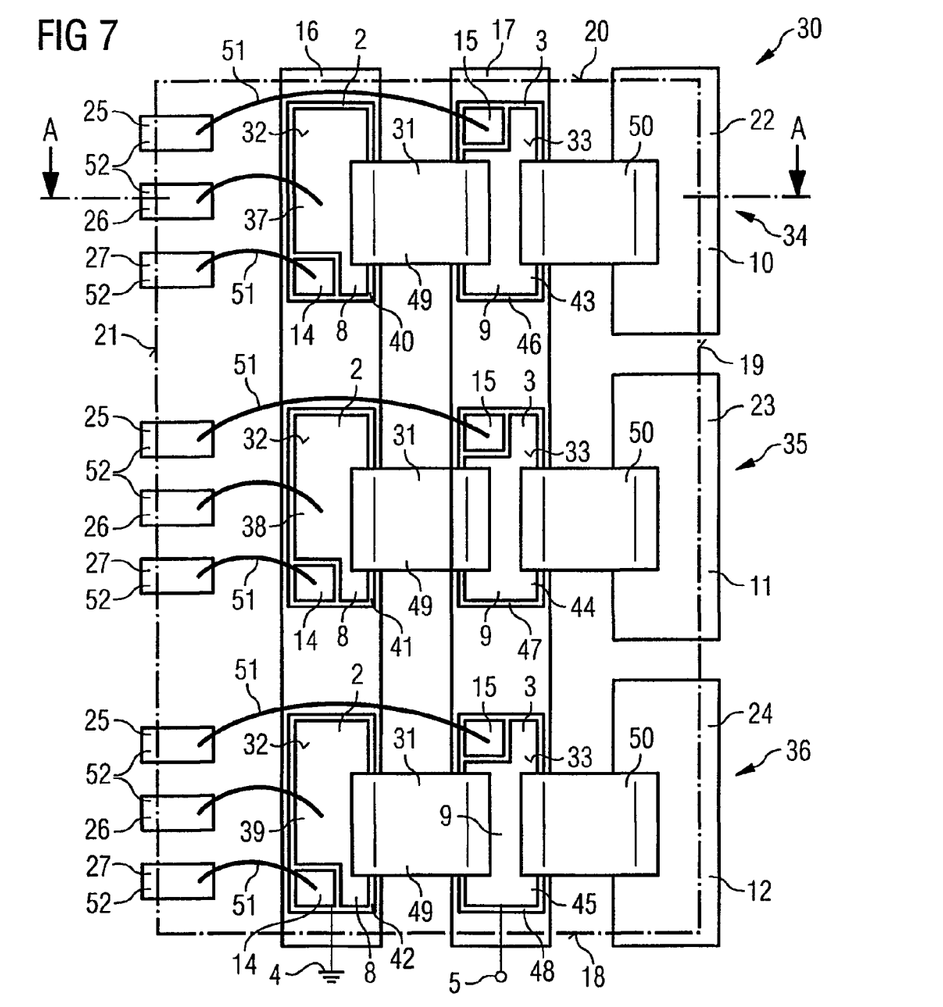
FIG. 7 shows a diagrammatic top view of a semiconductor module according to a further embodiment.

FIG. 7 shows a diagrammatic top view of a semiconductor module 30 according to a further embodiment, wherein the semiconductor module 30 provides for three-phase control with the aid of three half bridges 34, 35 and 36, the semiconductor chips 2 and 3 of which are arranged on common supply leads 16 and 17. Components having identical functions as in the preceding figures are marked by identical reference symbols and will not be explained separately. Such a semiconductor module 30 can be produced cost-effectively especially since completely identical components and identical wiring of the individual half bridge circuits 34, 35 and 36 are possible. In this arrangement, the semiconductor module 30 has separate output leads 22, 23 and 24 for corresponding power outputs 10, 11 and 12 for each half bridge circuit 34, 35 and 36. For this purpose, three p-channel MOSFETs 37, 38 and 39 with their drain electrodes 40, 41 and 42 are arranged on the supply potential lead 16. On the other hand, n-channel MOSFETs 43, 44 and 45 with their drain electrodes 46, 47 and 48 are provided on the supply lead 17.

Figure 8:
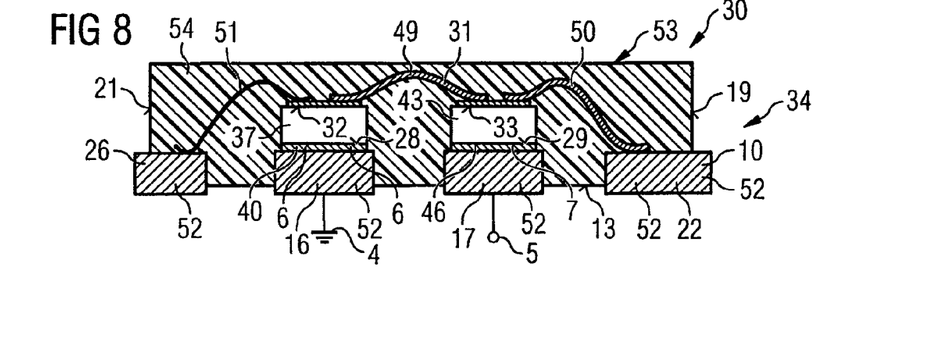
FIG. 8 shows a diagrammatic cross section through the semiconductor module according to FIG. 7 along the section plane A-A.

FIG. 8 shows a diagrammatic cross section through the semiconductor module 30 according to FIG. 7 along the section plane A-A. This diagrammatic cross section corresponds exactly to the diagrammatic cross section of FIG. 2 so that no new explanation is necessary.

Figure 9:
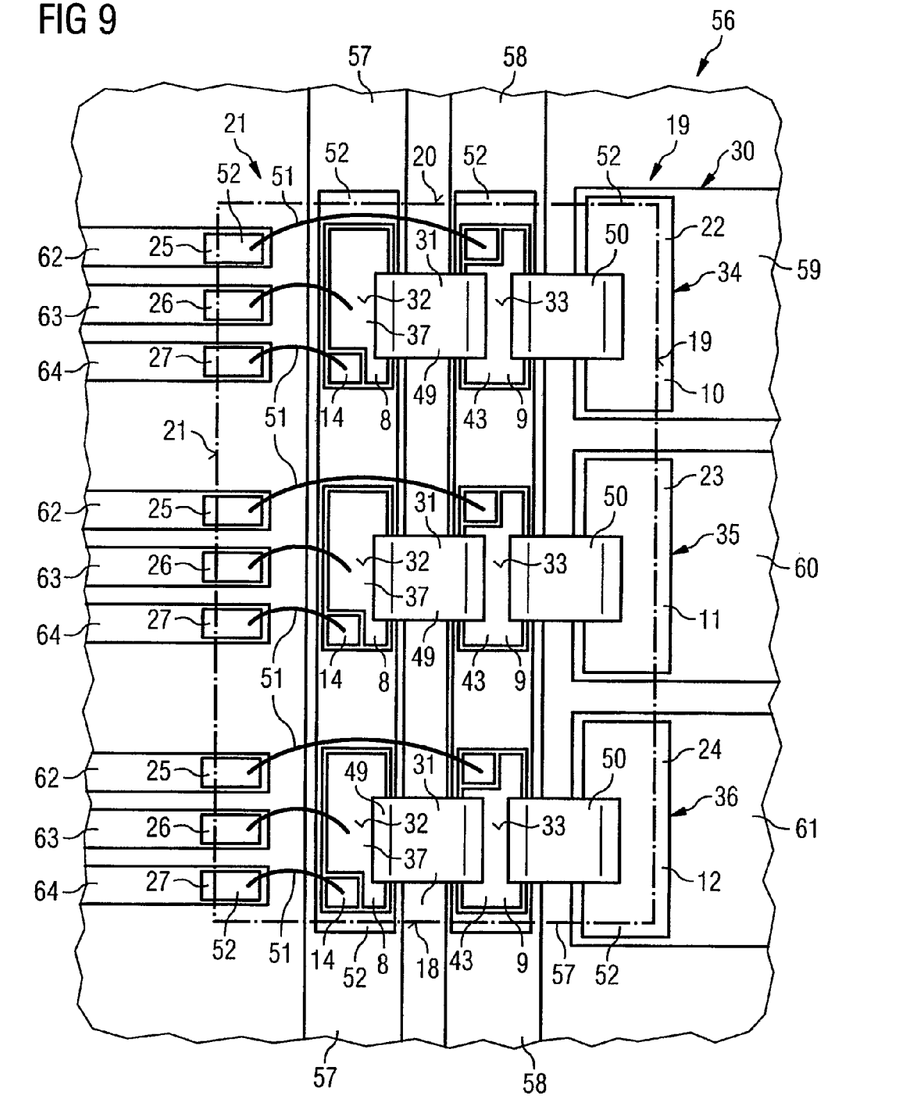
FIG. 9 shows a diagrammatic top view of a circuit board with mounted semiconductor module according to FIG. 7.

FIG. 9 shows a diagrammatic top view of a circuit board 56 with mounted semiconductor module 30 according to FIG. 7, wherein virtually the same order of electrical terminals 59 to 64 and of the supply rails 57 and 58 can be provided as are possible for individual surface-mounted semiconductor bridges 34 as shown in FIG. 5. For clarification, the contour of the package of the semiconductor module 30 is represented by the dot-dashed line 57.

Figure 10:
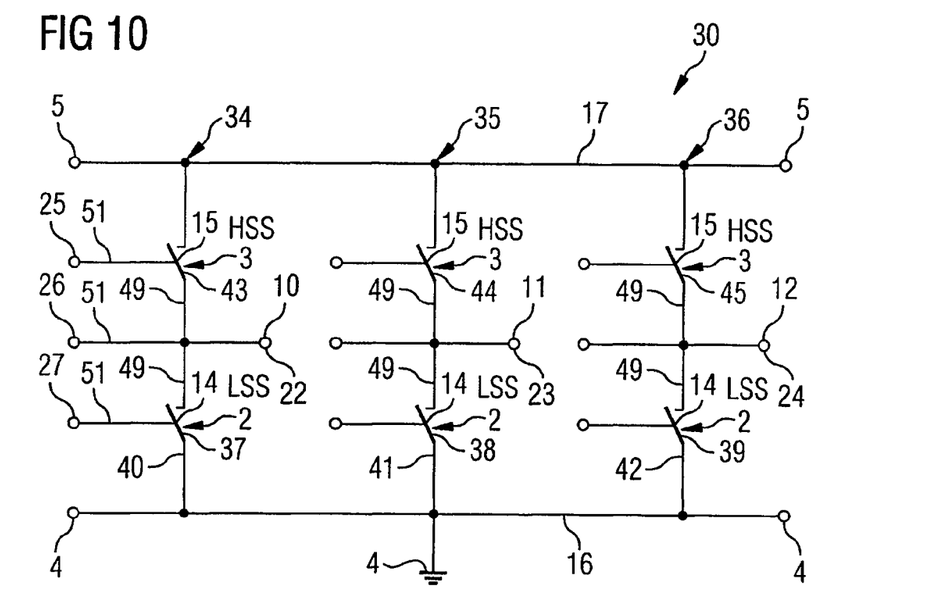
FIG. 10 shows a basic circuit diagram of a multiple half bridge circuit of the semiconductor module according to the further embodiment.

FIG. 10 shows a basic circuit diagram of a multiple half bridge circuit of the semiconductor module 30 according to the second embodiment. In this respect, the respective external contacts of the semiconductor module 30 are identified by circles which makes it clear that each of the three half bridges 34, 35 and 36 can be accessed individually both via the signal leads 25, 26 and 27 and, with respect to the power outputs 10, 11 and 12, via the output leads 22, 23 and 24. To be able to implement such half bridge circuits 34, 35 and 36 with the assembly concept shown in the preceding figures, complementary semiconductor chips 2 and 3 such as, for example, n-channel MOSFETs 43 to 45 and, in series therewith, p-channel MOSFETs 37 to 39, are in each case used for LSS switches and HSS switches for the half bridge circuits 34, 35 and 36.

Figure 11:
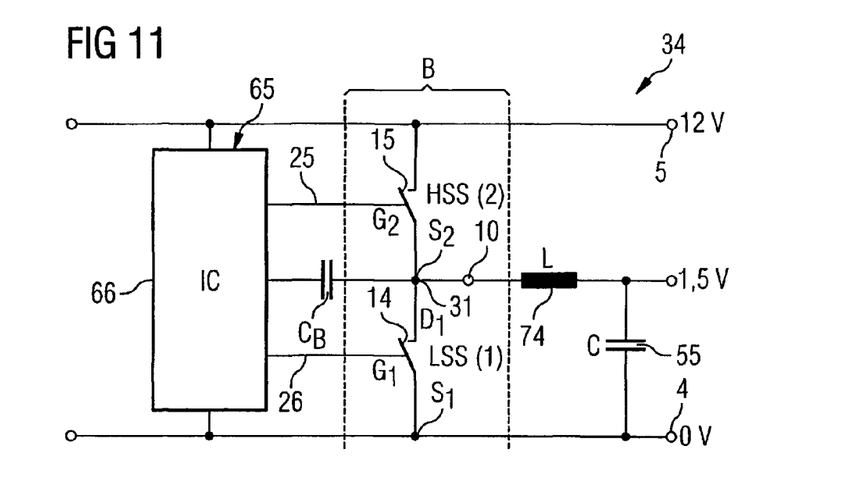
FIG. 11 shows a basic circuit diagram of a half bridge circuit with driver IC according to a further embodiment.

FIG. 11 shows a basic circuit diagram of a half bridge circuit 34 with driver according to a further embodiment. In this respect, an LSS switch and an HSS switch are arranged in series between a low potential 4 and a high potential 5. The control electrodes 14 and 15 of the switches are supplied with control signals by an integrated control circuit 65 of a control IC 66, whilst the circuit node 31 is effectively connected to the integrated circuit 65 via a capacitor $C_B$. The control IC 66 is arranged in a space-saving manner on the side to which the signal leads 25 and 26 of the semiconductor module are arranged on a circuit board 56 shown in FIG. 12. In addition, it is not a problem to arrange, for example, a smoothing capacitor 55 and/or a coil 74 in an area-saving manner between the respective output leads 22 of the circuit output 10 and, for example, the low supply potential 4.

Figure 12:
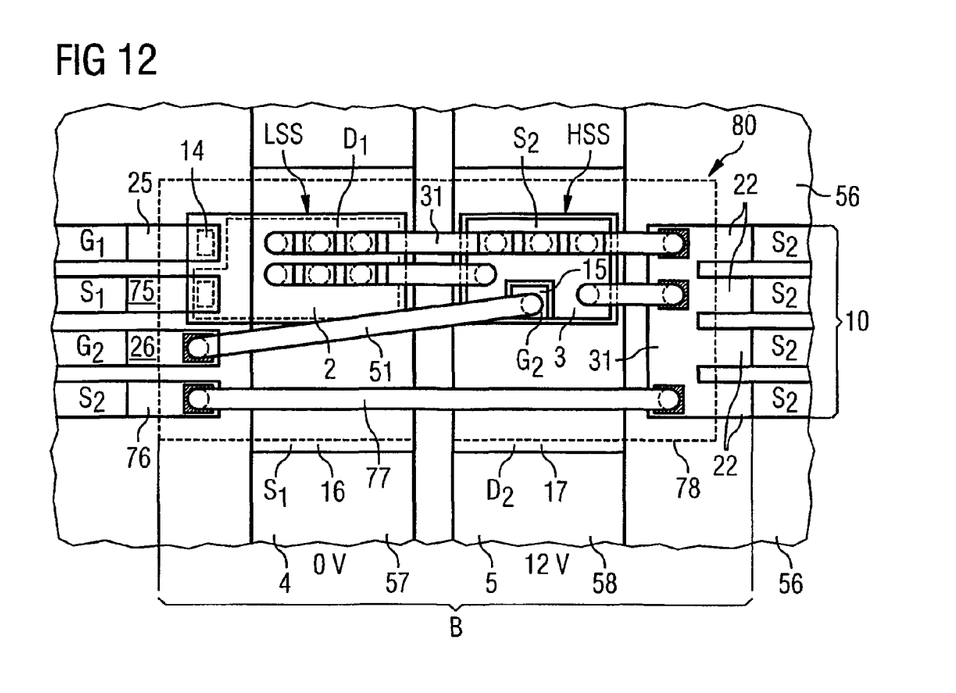
FIG. 12 shows a diagrammatic top view of a circuit board with mounted semiconductor module according to section B of FIG. 11.

FIG. 12 shows a diagrammatic top view of a circuit board 56 with mounted semiconductor module 80 according to section B of FIG. 11. The plastic package of the semiconductor module 80 has been omitted and only the outlines of the plastic package are marked by a dashed line 78. In this embodiment, the two semiconductor chips 2 and 3 are similar MOSFET semiconductor chips and not complementary as in the semiconductor modules 1 and 30 described above.

In this embodiment, the semiconductor chip 2 is mounted as LSS switch with its source electrode S1 in flip chip arrangement on the supply lead 16 and electrically connected to the lead 75 which enables the control IC 66 to be connected to the low potential 4 of the supply lead 16. The lead 76 enables the capacitor $C_B$ to be connected via a wide-spanned wire bond 77 to the circuit node 31 of the half bridge circuit 34. A further wide-spanned wire bond 51 is provided between the signal lead 26 and the control electrode 15 of the HSS switch. Due to these wide-spanned wire bonds 51 and 77, it is possible to integrate this semiconductor module 80 on a circuit board 56 which only has a single-layer structure so that it is not necessary to use a high-cost multi-layer circuit board.

FIG. 13 shows a diagrammatic top view of a circuit board 56 with mounted semiconductor modules 90 of a two-phase circuit according to a further embodiment. In this respect, semiconductor modules 90 having an internal structure as already shown in FIG. 1 are fixed with their leads 68 on a power output terminal 59 for a first phase connection 79 and on a power output terminal 59 of the circuit board 56 for a second phase connection 81.

Figure 14:
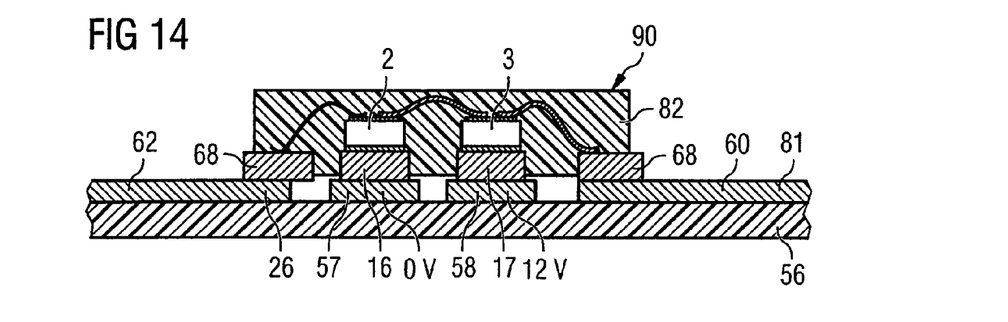
FIG. 14 shows a diagrammatic cross section through one of the semiconductor modules according to FIG. 13 along the section plane A-A.

FIG. 14 shows a diagrammatic cross section through one of the semiconductor modules 90 according to FIG. 13 along the section plane A-A, the structure and connecting arrangement corresponding to the cross section according to FIG. 8, with the difference that individual semiconductor modules 90 with separate plastic packages 82 are provided for each phase and not all phases are accommodated in one plastic package as in FIG. 8. Correspondingly, the circuit board 56 is provided here on which the semiconductor modules are mounted with their footprints shown in FIG. 3.

LIST OF REFERENCE DESIGNATIONS

1 Semiconductor module (first embodiment)
2 Semiconductor chip (LSS)
3 Semiconductor chip (HSS)
4 Supply potential (low)
5 Supply potential (high)
6 Power supply electrode (for 2)
7 Power supply electrode (for 3)
8 Power output electrode (for 2)
9 Power output electrode (for 3)
10 Power output
11 Power output
12 Power output
13 Underside of the semiconductor module
14 Control electrode (for 2)
15 Control electrode (for 3)
16 Supply lead (for 4)
17 Supply lead (for 5)
18 Edge area of the semiconductor module
19 Edge area
20 Edge area
21 Edge area
22 Output lead
23 Output lead
24 Output lead
25 Signal lead
26 Signal lead
27 Signal lead
28 Back (for 2)
29 Back (for 3)
30 Semiconductor module (further embodiment)
31 Circuit node
32 Top side (for 2)
33 Top side (for 3)
34 Half bridge circuit
35 Half bridge circuit
36 Half bridge circuit
37 p-channel MOSFET
38 p-channel MOSFET
39 p-channel MOSFET
40 Drain electrode (p-channel)
41 Drain electrode (p-channel)
42 Drain electrode (p-channel)
43 n-channel MOSFET
44 n-channel MOSFET
45 n-channel MOSFET
46 Drain electrode (n-channel)
47 Drain electrode (n-channel)
48 Drain electrode (n-channel)
49 Connecting element (source to source)
50 Connecting element (source to power output)
51 Wire bonds or connecting element of the signal terminals
52 Flat external contact
53 Plastic package
54 Plastic compound
55 Capacitor
56 Circuit board
57 Supply potential rail (for 4)
58 Supply potential rail (for 5)
59 Power output terminal (of the board)
60 Power output terminal (of the board)
61 Power output terminal (of the board)
62 Signal input terminal (of the board)
63 Signal input terminal (of the board)
64 Signal input terminal (of the board)
65 Integrated control circuit
66 Control IC
67 Dot-dashed line
68 Lead
69 Semiconductor module position
70 Diffusion solder layer
71 Position for semiconductor module
72 Position for semiconductor module
73 Position for semiconductor module
74 Coil
75 Lead
76 Lead
77 Wire bond (wide-spanned)
78 Dashed line
79 First phase connection
80 Semiconductor module (further embodiment)
81 Second phase connection
82 Plastic package
90 Semiconductor module (further embodiment)
LSS Low side switch
HSS High side switch

What is claimed is:

1. A semiconductor module comprising:
a plurality of semiconductor chips each with
a power supply electrode on its back for applying a supply potential,
a power output electrode on its top side for transferring an output current to power outputs of the semiconductor module, and
a control electrode for switching the semiconductor chip;
a plurality of leads arranged on the underside of the semiconductor module comprising:
supply leads, each of the semiconductor chips being mounted with its power supply electrodes on a supply lead,
signal leads electrically connected to the control electrodes or the power output electrodes; and
output leads electrically connected to the power output electrodes, the semiconductor chips are not mounted on the output leads.

2. The semiconductor module according to claim 1, wherein at least one of the semiconductor chips has on its back a power supply electrode, the two-dimensional extent of which corresponds to the back and which is arranged with its back on one of the supply leads, wherein the supply leads are arranged in parallel adjacently to one another on the underside of the semiconductor module and have different supply potentials and wherein the output leads are arranged in an edge area of the underside of the semiconductor module perpendicularly to the supply leads, and wherein the signal leads are arranged in an edge area opposite to the output leads perpendicularly to the supply leads.

3. The semiconductor module according to claim 1, wherein the semiconductor chips have control electrodes and power output electrodes on their top sides, wherein the two-dimensional extents of the power output electrodes approximately correspond to the top sides.

4. The semiconductor module according to claim 1, wherein the semiconductor module has at least one half bridge circuit with two semiconductor chips and wherein the power output electrodes of the semiconductor chips forming the half bridge circuit are electrically connected to one another by a first connecting element and are further electrically connected by a second connecting element to the same output lead.

5. The semiconductor module according to claim 1, wherein the semiconductor module has a number of half bridge circuits and a supply lead for a ground potential, on which p-channel MOSFETs are arranged with their drain electrodes, and a further supply lead for a supply potential, on which n-channel MOSFETs are arranged with their drain electrodes.

6. The semiconductor module according to claim 1, wherein the semiconductor module has at least one half bridge circuit with a supply potential rail for a ground potential, on which at least one n-channel MOSFET is mounted as a low side switch (LSS) transistor of the half bridge circuit with its source electrode in flip chip arrangement, and with a further supply potential rail for a supply potential on which at least one n-channel MOSFET is mounted with its drain electrode.

7. The semiconductor module according to claim 5, wherein the power output electrodes of the semiconductor chips of a half bridge circuit are electrically connected to one another via connecting elements and form a circuit node which is electrically connected to one of the output leads via a further connecting element.

8. The semiconductor module according to claim 1, wherein the signal leads are electrically connected to the control electrodes and the power output electrodes via bonding wires.

9. The semiconductor module according to claim 1, wherein the semiconductor module has a diffusion solder layer between the power supply electrodes of a semiconductor chip and the supply leads.

10. The semiconductor module according to claim 1, wherein the diffusion soldering material has an intermetallic phase from the group of AuSn, AgSn, CuSn or AgIn.

11. The semiconductor module according to claim 1, wherein a high side switch (HSS) power MOSFET is arranged on the supply lead with high supply potential and a low side switch (LSS) power MOSFET is arranged on the supply lead with low supply potential.

12. The semiconductor module according to claim 11, wherein the (HSS) power MOSFET has an integrated gate driver.

13. The semiconductor module according to claim 1, wherein the control electrode of the semiconductor chips has a vertical trench gate electrode.

14. The semiconductor module according to claim 1, wherein the power supply electrodes are a collector electrode and the power output electrode is an emitter electrode of a vertical insulated gate bipolar transistor (IGBT) and the control electrode is an insulated gate electrode.

15. The semiconductor module according to claim 1, wherein the leads form surface-mountable flat external contacts of the semiconductor module.

16. The semiconductor module according to claim 1, wherein the semiconductor module has a plastic package, in the plastic package compound of which the at least two semiconductor chips, connecting elements and surfaces of the leads are embedded and wherein external contacts of the leads on the underside of the semiconductor module are kept free of plastic package compound.

17. The semiconductor module according to claim 1, wherein at least one capacitor or one coil is arranged between a power output and a low supply potential.

18. A circuit board with at least one semiconductor module comprising:
   a plurality of semiconductor chips each with
      a power supply electrode on its back for applying a supply potential
      a power output electrode on its top side for transferring an output current to power outputs of the semiconductor module, and
      a control electrode for switching the semiconductor chip;
   a plurality of leads on the underside of the semiconductor module comprising:
      supply leads, each of the semiconductor chips being mounted with its power supply electrode on a supply lead,
      output leads electrically connected to the power output electrodes, the semiconductor chips are not mounted on the output leads,
      signal leads electrically connected to the control electrodes or the power output electrodes,
   wherein the circuit board has at least two supply potential rails which are arranged in parallel adjacently to one another in accordance with the supply leads of the semiconductor module and wherein the circuit board has perpendicularly to the supply potential rails power output terminals for the output leads of the semiconductor module on one side of the supply potential rails and signal input terminals for the signal leads of the semiconductor module on an opposite side.

19. A circuit board with at least one semiconductor module comprising:
   semiconductor chips each with
      a power supply electrode on its back for applying a supply potential
      a power output electrode on its top side for transferring an output current to power outputs of the semiconductor module, and
      a control electrode for switching the semiconductor chip;
   leads on the underside of the semiconductor module comprising:
      supply leads on which the semiconductor chips are arranged with their power supply electrodes,
      output leads which are effectively connected to the power output electrodes,
      signal leads which are effectively connected to the control electrodes or the power output electrodes,
   wherein the circuit board has at least two supply potential rails which are arranged in parallel adjacently to one another in accordance with the supply leads of the semiconductor module and wherein the circuit board has perpendicularly to the supply potential rails power output terminals for the output leads of the semiconductor module on one side of the supply potential rails and signal input terminals for the signal leads of the semiconductor module on an opposite side, and wherein at least one capacitor or one coil is arranged between a supply potential rail with low supply potential and a power output terminal.

20. A circuit board with at least one semiconductor module comprising:
- semiconductor chips each with
  - a power supply electrode on its back for applying a supply potential
  - a power output electrode on its top side for transferring an output current to power outputs of the semiconductor module, and
  - a control electrode for switching the semiconductor chip;
- leads on the underside of the semiconductor module comprising:
  - supply leads on which the semiconductor chips are arranged with their power supply electrodes,
  - output leads which are effectively connected to the power output electrodes,
- signal leads which are effectively connected to the control electrodes or the power output electrodes,
- wherein the circuit board has at least two supply potential rails which are arranged in parallel adjacently to one another in accordance with the supply leads of the semiconductor module and wherein the circuit board has perpendicularly to the supply potential rails power output terminals for the output leads of the semiconductor module on one side of the supply potential rails and signal input terminals for the signal leads of the semiconductor module on an opposite side, and
- wherein the signal input terminals are electrically connected via conductor tracks of the circuit board to at least one integrated control circuit of a control IC which drives both nodes and the control electrodes of semiconductor chips of a half bridge circuit and is arranged on the circuit board to the side perpendicular to the supply potential rails on which the signal input terminals are arranged.

21. A method of using a circuit board with at least one semiconductor module for an on-board system with a semiconductor module in multi-chip module (MCM) construction, wherein the semiconductor module comprises:
- a plurality of semiconductor chips each with
  - a power supply electrode on its back for applying a supply potential
  - a power output electrode on its top side for transferring an output current to power outputs of the semiconductor module, and
  - a control electrode for switching the semiconductor chip;
- a plurality of leads on the underside of the semiconductor module comprising:
  - supply leads, each of the semiconductor chips being mounted with its power supply electrode on a supply lead,
  - output leads electrically connected to the power output electrodes, the semiconductor chips are not mounted on the output leads,
  - signal leads electrically connected to the control electrodes or the power output electrodes, and wherein the circuit board has at least two supply potential rails which are arranged in parallel adjacently to one another in accordance with the supply leads of the semiconductor module and wherein the circuit board has perpendicularly to the supply potential rails power output terminals for the output leads of the semiconductor module on one side of the supply potential rails and signal input terminals for the signal leads of the semiconductor module on an opposite side.

22. The semiconductor module of claim 1, wherein each of the power supply electrodes is directly mounted on, and electrically connected to, a respective one of the supply leads.

23. The circuit board of claim 18, wherein each of the power supply electrodes is directly mounted on, and electrically connected to, a respective one of the supply leads.

24. A semiconductor module, comprising:
- a plurality of semiconductor chips, each of the semiconductor chips having a first side and an opposing second side, and each comprising:
  - a power supply electrode disposed on the first side of the semiconductor chip,
  - a power output electrode disposed on the second side of the semiconductor chip, and
  - a control electrode;
- a plurality of supply leads on a first side of the semiconductor module, wherein each of the power supply electrodes is electrically coupled with, and disposed on, one of the supply leads;
- a plurality of signal leads on the first side of the semiconductor module, each of the signal leads is electrically coupled to either one of the control electrodes or one of the power output electrodes;
- a plurality of output leads on the first side of the semiconductor module, each electrically coupled with one of the power output electrodes; and
- at least two supply potential rails which are arranged in parallel adjacently to one another in accordance with the supply leads of the semiconductor module,
- wherein the semiconductor module has perpendicularly to the supply potential rails power output terminals for the output leads on one side of the supply potential rails and signal input terminals for the signal leads on an opposite side of the supply potential rails.

25. The semiconductor module of claim 24, wherein the supply leads are each formed as a strip and extend parallel with each other with a first direction.

26. The semiconductor module of claim 25, wherein the signal leads are each formed as a strip and extend parallel with each other in a second direction perpendicular to the first direction.

27. The semiconductor module of claim 26, wherein the signal leads are arranged as a plurality of groups of strip-like conductors, such that a spacing between strip-like conductors that are grouped together is smaller than a spacing between the groups.

28. The semiconductor module of claim 27, wherein the output leads are each formed as a strip and extend parallel with each other in the second direction.

29. The semiconductor module of claim 28, wherein the semiconductor module comprises more of the signal leads than of the output leads.

30. The semiconductor module of claim 24, wherein the semiconductor module comprises a half bridge circuit that comprises two of the semiconductor chips.

31. The semiconductor module of claim 24, wherein the signal leads are each electrically connected to either one of the control electrodes or one of the power output electrodes via a bonding wire.

32. The semiconductor module of claim 24, further comprising, for each of the semiconductor chips, a diffusion solder layer disposed between, and electrically interconnecting, the power supply electrode of the semiconductor chip and one of the supply leads.

33. The semiconductor module of claim 32, wherein the diffusion soldering material comprises an intermetallic phase selected from the group consisting of AuSn, AgSn, CuSn, and AgIn.

34. The semiconductor module of claim 24, wherein the control electrode of each of the semiconductor chips comprises a vertical trench gate electrode.

35. The semiconductor module of claim 24, wherein:
the power supply electrodes are each a collector electrode, and the power output electrodes are each an emitter electrode, of a vertical insulated gate bipolar transistor (IGBT), and
the control electrode comprises an insulated gate electrode.

36. The semiconductor module of claim 24, wherein the each of the supply, signal, and output leads comprises a surface-mountable flat external contact of the semiconductor module.

37. The semiconductor module of claim 24, further comprising a plastic package encasing the plurality of semiconductor chips, wherein at least a portion of each of the supply, signal, and output leads is exposed outside of the plastic package.

38. The circuit board of claim 18 wherein the semiconductor module has at least one half bridge circuit with two semiconductor chips and wherein the power output electrodes of the semiconductor chips forming the half bridge circuit are electrically connected to one another by a first connecting element and are further electrically connected by a second connecting element to the same output lead.

39. The circuit board of claim 21 wherein the semiconductor module has at least one half bridge circuit with two semiconductor chips and wherein the power output electrodes of the semiconductor chips forming the half bridge circuit are electrically connected to one another by a first connecting element and are further electrically connected by a second connecting element to the same output lead.

40. The circuit board of claim 18 wherein the signal leads are electrically connected to the control electrodes and the power output electrodes via bonding wires.

41. The circuit board of claim 21 wherein the signal leads are electrically connected to the control electrodes and the power output electrodes via bonding wires.

* * * * *